United States Patent
Zou

(10) Patent No.: US 7,262,661 B2
(45) Date of Patent: Aug. 28, 2007

(54) VARIABLE GAIN AMPLIFIER WITH TEMPERATURE COMPENSATION AND GAIN LINEARITY ENHANCEMENT

(75) Inventor: Min Z. Zou, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 155 days.

(21) Appl. No.: 11/166,279

(22) Filed: Jun. 27, 2005

(65) Prior Publication Data

US 2006/0290428 A1 Dec. 28, 2006

(51) Int. Cl.
H03F 3/45 (2006.01)
(52) U.S. Cl. ........................ 330/256; 330/254
(58) Field of Classification Search ................ 330/254, 330/256
See application file for complete search history.

(56) References Cited

U.S. PATENT DOCUMENTS

| | | | |
|---|---|---|---|
| 5,077,541 A | 12/1991 | Gilbert | |
| 5,432,478 A | 7/1995 | Gilbert | |
| 5,481,218 A * | 1/1996 | Nordholt et al. | ............. 327/350 |
| 5,526,058 A | 6/1996 | Sano et al. | |
| 5,684,431 A | 11/1997 | Gilbert et al. | |
| 5,742,203 A | 4/1998 | Van De Plassche et al. | |
| 5,874,857 A * | 2/1999 | Roth et al. | ................... 330/254 |
| 5,910,751 A | 6/1999 | Winn et al. | |
| 6,172,549 B1 | 1/2001 | Gilbert | |
| 6,204,719 B1 | 3/2001 | Gilbert | |
| 6,348,829 B1 | 2/2002 | Gilbert | |
| 6,429,720 B1 | 8/2002 | Gilbert | |
| 6,437,630 B1 | 8/2002 | Gilbert | |
| 6,489,849 B1 | 12/2002 | Gilbert | |
| 6,525,601 B2 | 2/2003 | Gilbert | |
| 6,583,667 B1 | 6/2003 | Dasgupta et al. | |
| 6,894,564 B1 * | 5/2005 | Gilbert | ........................ 330/254 |
| 6,958,653 B2 * | 10/2005 | Vaara et al. | ................. 330/256 |
| 2004/0251965 A1 | 12/2004 | Ueda et al. | |

FOREIGN PATENT DOCUMENTS

EP 0 633 657 A2 1/1995

OTHER PUBLICATIONS

Analog Related Product AD8367, "500MHz, 45dB Linear-in-dB Variable Gain Amplifier," with AGC Detector, released most likely in 2001.
Analog Related Product AD8362, "50Hz to 2.7GHz 60dB TruPwr Detector," released in 2003.
Analog Related Product AD8361, "2.5GHz TruPwr Detector," released most likely in 2001.

* cited by examiner

*Primary Examiner*—Patricia Nguyen
(74) *Attorney, Agent, or Firm*—McDermott Will & Emery LLP

(57) ABSTRACT

A variable gain amplifier contains a plurality of differential transistor pairs. A temperature dependent current is generated in the current path of each differential transistor pair. A generated gain control current is converted to a temperature dependent gain control current and applied in circuit with control inputs of the transistors of the paired differential transistors. The temperature dependent gain control current is obtained from a gain control current corresponding to a desired gain which is then multiplying the control current by the temperature dependent current. The temperature dependent gain control current is modified to compensate for gain non-linearity by introducing an offset as a function of the gain control current.

8 Claims, 7 Drawing Sheets

VARIABLE GAIN AMPLIFIER WITH
TEMPERATURE COMPENSATION AND
GAIN LINEARITY ENHANCEMENT

RELATED APPLICATION

This application contains subject matter related to copending U.S. application Ser. No. 11/166,089 of Min Z. Zou, filed Jun. 27, 2005, the disclosure of which is hereby incorporated in the present disclosure.

TECHNICAL FIELD

The present disclosure relates to a variable gain amplifier, and more particularly to compensation for temperature and linearity in an amplifier with a wide gain control range.

BACKGROUND

The above described copending patent application describes the need for high accuracy variable gain amplification over wide frequency bandwidths. An implementation is described in which a plurality of variable gain amplifier stages are coupled by an attenuation circuit that receives a voltage input to be amplified. A control circuit activates each of the variable gain amplifier stages in a seamless manner in accordance with a control signal applied to a voltage control node, while maintaining no more than one of the stages active at any time. Each amplifier stage should provide variable gain with accurate linearity over that portion of the control voltage range within which it is operable.

A known prior art variable gain amplifier circuit is described, for example, in the publication *A Power-Efficient, Low-Distortion Variable Gain Amplifier Consisting of Coupled Differential Pairs*, by van Lieshout and van de Plassche, IEEE Journal of Solid-State Circuits, Vol. 32, No. 12, December 1997, and in U.S. Pat. No. 5,742,203 to Van DE Plassche et al. FIG. 1 of the present disclosure illustrates a similar prior art variable gain amplifier. Each stage of a wide dynamic range multi-stage variable gain amplifier may comprise a circuit such as shown in FIG. 1 which, for ease of explanation, is designated with "k" character references, representing amplifier stage K.

The amplifier stage receives an input Vin+, Vin− and provides an output Iout+, Iout−. The inputs are applied to emitter follower transistors 20 and 22, which are coupled to ground through respective current sources. Connected in series between transistor 20 and ground are resistors 24-32, and a current gain control GCk. The gain control may be derived from a variable control voltage setting (not shown) in the manner described, for example, in the above-identified Min application. Connected in series between transistor 22 and ground are resistors 34-42, and gain control GCk.

Connected between Iout+ and Iout− are six differential pairs of transistors. The emitters of a first differential pair of transistors 44 and 66 are connected together. The emitters of a second differential pair of transistors 46 and 64 are connected together. The emitters of a third differential pair of transistors 48 and 62 are connected together. The emitters of a fourth differential pair of transistors 50 and 60 are connected together. The emitters of a fifth differential pair of transistors 52 and 58 are connected together. The emitters of a sixth differential pair of transistors 54 and 56 are connected together. In circuit with each of the transistor emitters is a tail current source.

The base of transistor 44 is connected to the emitter of transistor 20. The base of transistor 48 is connected to the junction between resistors 26 and 28. The base of transistor 50 is connected to the junction between resistors 28 and 30. The base of transistor 52 is connected to the junction between resistors 30 and 32. The base of transistor 54 is connected to the junction between resistor 32 and GCk. The base of transistor 56 is connected to the emitter of transistor 22. The base of transistor 58 is connected to the junction between resistors 34 and 36. The base of transistor 60 is connected to the junction between resistors 36 and 38. The base of transistor 62 is connected to the junction between resistors 38 and 40. The base of transistor 64 is connected to the junction between resistors 40 and 42. The base of transistor 66 is connected to the junction between resistor 42 and GCk.

Transistors 20 and 22 function as a buffer circuit for the voltage input. The emitters of these transistors provide versions of the input signal to the bases of the transistors 44-66 that are shifted in accordance with the voltage drops across resistors 24-42. If the resistances of all resistors are equal (R), an offset voltage exists between the bases of each differential pair of transistors. The offset for the first pair is equal to the difference between the buffered input voltage at the base of transistor 44 and the voltage drops across the five resistors 34 through 42, or proportional to 5×R. The offsets for the second through sixth pairs are proportional to 3×R, R, R, 3×R and 5×R, respectively. The offset for each pair is designated $R_i$, wherein i represents the number of differential pairs.

With zero gain control currents in the resistor paths, all differential pairs operate without offset and maximum gain is obtained. Increasing the gain control current will produce different offsets across the individual pairs, thereby downwardly adjusting the gain. The gain vs control current is represented by the following relationship:

$$I_{out}(V_{in}) \alpha_F * I_{ptat} * \sum_{i=1}^{n} \tanh \frac{V_{in} - R_i \cdot GC_i}{2V_T} \qquad (1)$$

Where $I_K$ is the differential tail current, $\alpha_F$ is the ratio between collector and emitter current of the corresponding transistors, $V_T$ is the thermal voltage, and $R_i$ is the resistance offset value for differential pair i. The transconductance can be derived by differentiating $I_{out}$ with respect to $V_{in}$.

$$gm(V_{in}) = \frac{\alpha_F * I_{ptat}}{2V_T} * \sum_{i=1}^{n} \text{sech}^2 \frac{V_{in} - R_i \cdot GC_i}{2V_T} \qquad (2)$$

The gain vs gain control current GC is plotted in FIG. 2. The linear-in-dB output vs input relationship is not precise. The plot exhibits curvature, the extent of which can be appreciated more clearly in the plot of FIG. 3. Linearity error is plotted over the range of gain control current GC in the diagram of that figure. The gain is relatively linear in the central range, of approximately 0.4 m to 0.6 m, while having increasing error through the range above 0.6 m. A need exists for higher accuracy gain control over the extended range.

The gain control current is normally referenced to a voltage that is temperature-independent. As evident from equation (2), transconductance is a function of thermal voltage $V_T$, which varies with temperature. $V_T$ is an element in the denominator of two portions of the gain equation. Thus, in the known amplifier gain stage of FIG. 1, gain is variable with temperature. A need exists to compensate for such variability so that the amplifier gain is independent of temperature.

SUMMARY OF THE DISCLOSURE

The above described needs of the variable gain amplifier of the prior art are fulfilled, at least in part, by generating a temperature dependent current in the current path of each differential transistor pair, converting a generated gain control current to a temperature dependent gain control current, and applying the temperature dependent gain control current in circuit with control inputs of the transistors of the paired differential transistors. The temperature dependent gain control current is obtained from a gain control current corresponding to a desired gain and then multiplying the control current by the temperature dependent current. The temperature dependent gain control current is modified to compensate for gain non-linearity by introducing an offset as a function of the gain control current.

In an embodiment of the present disclosure, a variable gain amplifier comprises a plurality of differential transistor pairs coupled in parallel. Each transistor pair is coupled to a temperature dependent current source. Control inputs of first transistors of the transistor pairs are coupled to each other in series through respective impedances and to a temperature dependent gain control signal. Control inputs of second transistors of the transistor pairs are coupled to each other in series through respective impedances and to the temperature dependent gain control signal.

A temperature compensation circuit, configured to generate the temperature dependent gain control signal, includes a first transistor having a control terminal coupled to a control current source and to a zero temperature coefficient source. The transistor output is coupled to a current source that is proportional to temperature. Output of a second transistor is coupled to the current source proportional to temperature. The conduction current of the second transistor is applied as the temperature dependent gain control signal. Emitter followers may be coupled to the control terminals of the first and second transistors to reduce base current effects. Cross-coupled transistors may be coupled between the emitter follower circuits and the control terminals of the first and second transistors to minimize voltage error. Preferably, a voltage offset circuit is coupled between the cross-coupled transistors and a control terminal of the second transistor to compensate for gain non-linearity.

Additional advantages will become readily apparent to those skilled in this art from the following detailed description, wherein only the preferred embodiments are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Implementations of the present invention are illustrated by way of example, and not by way of limitation, in the figures of the accompanying drawings and in which like reference numerals refer to similar elements.

DETAILED DESCRIPTION

Figure 4:
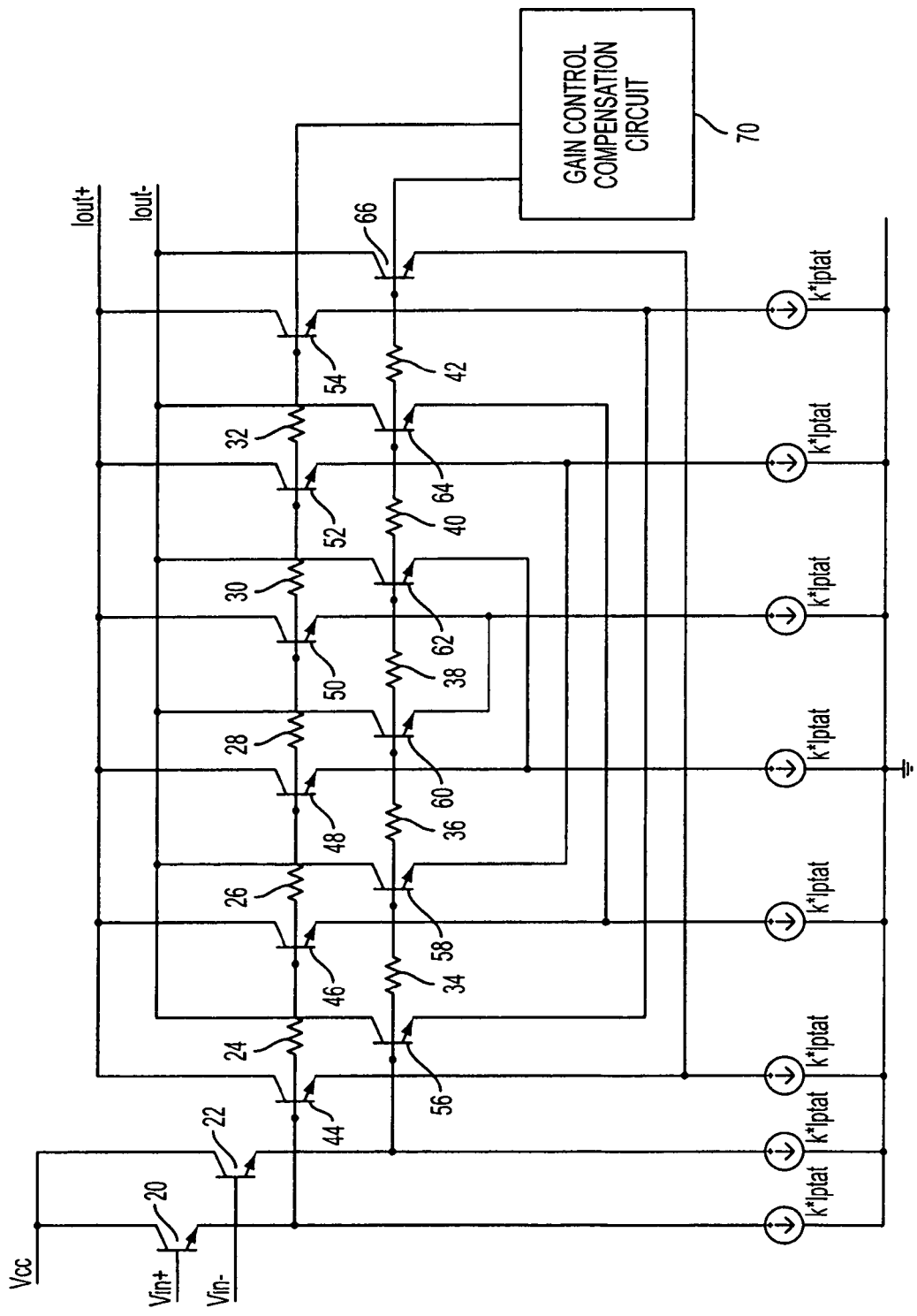
FIG. 4 is a diagram of a variable gain amplifier stage in accordance with the present invention.

FIG. 4 is a diagram of a variable gain amplifier stage in accordance with the present invention. The coupled emitters of each of the six differential transistor pairs are coupled to ground through a tail current source that is proportional to absolute temperature (k*Iptat). Buffer transistors 20 and 22 also are each coupled to ground through a current source k*Iptat. Gain compensation circuit 70 is coupled to the control inputs of each of the transistors 44-56 of the six differential pairs through the resistor circuit including resistors 24-42.

Figure 5:
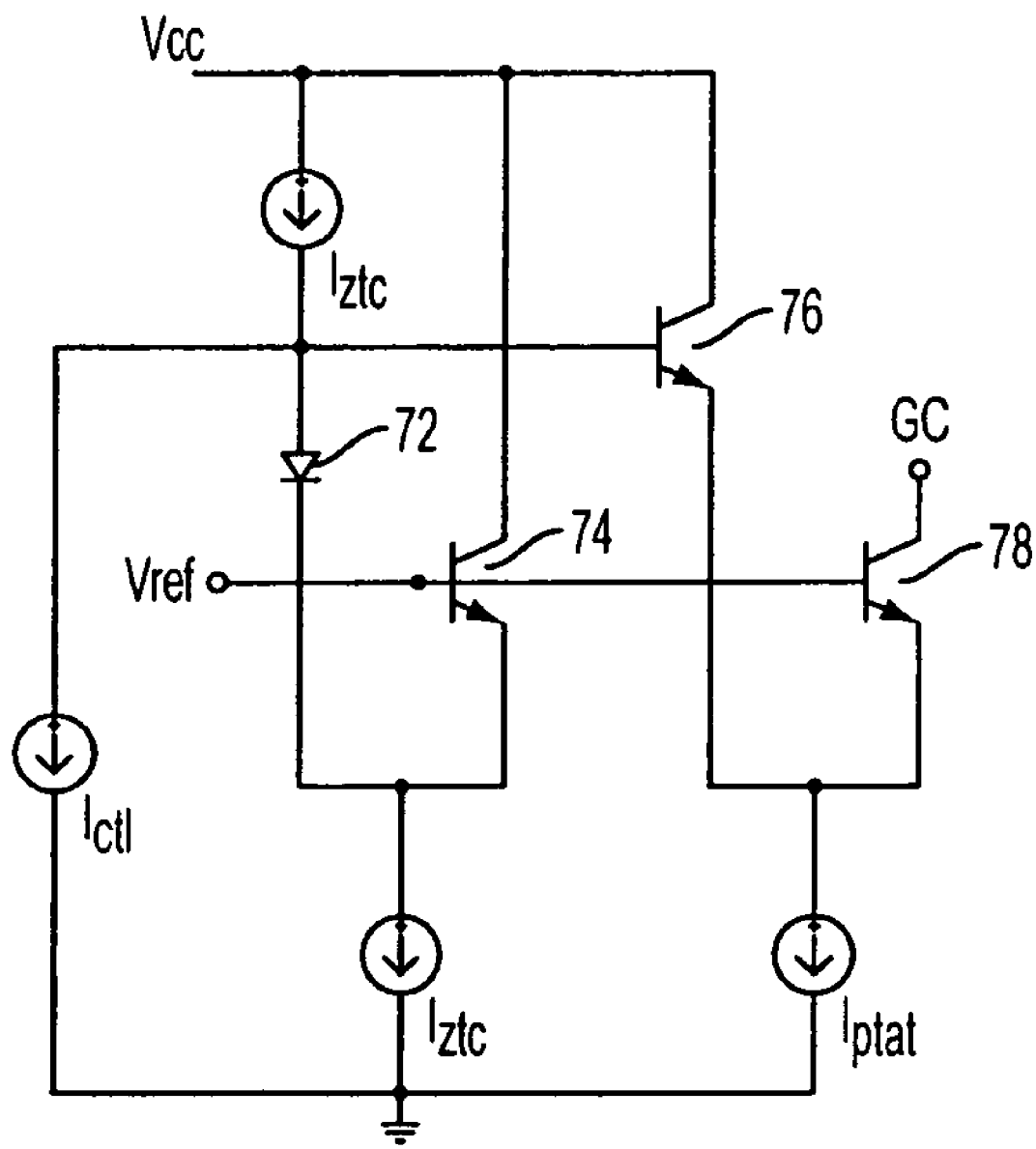
FIG. 5 is a circuit diagram of a circuit that may be used to implement the block shown in FIG. 4.
Figure 6:
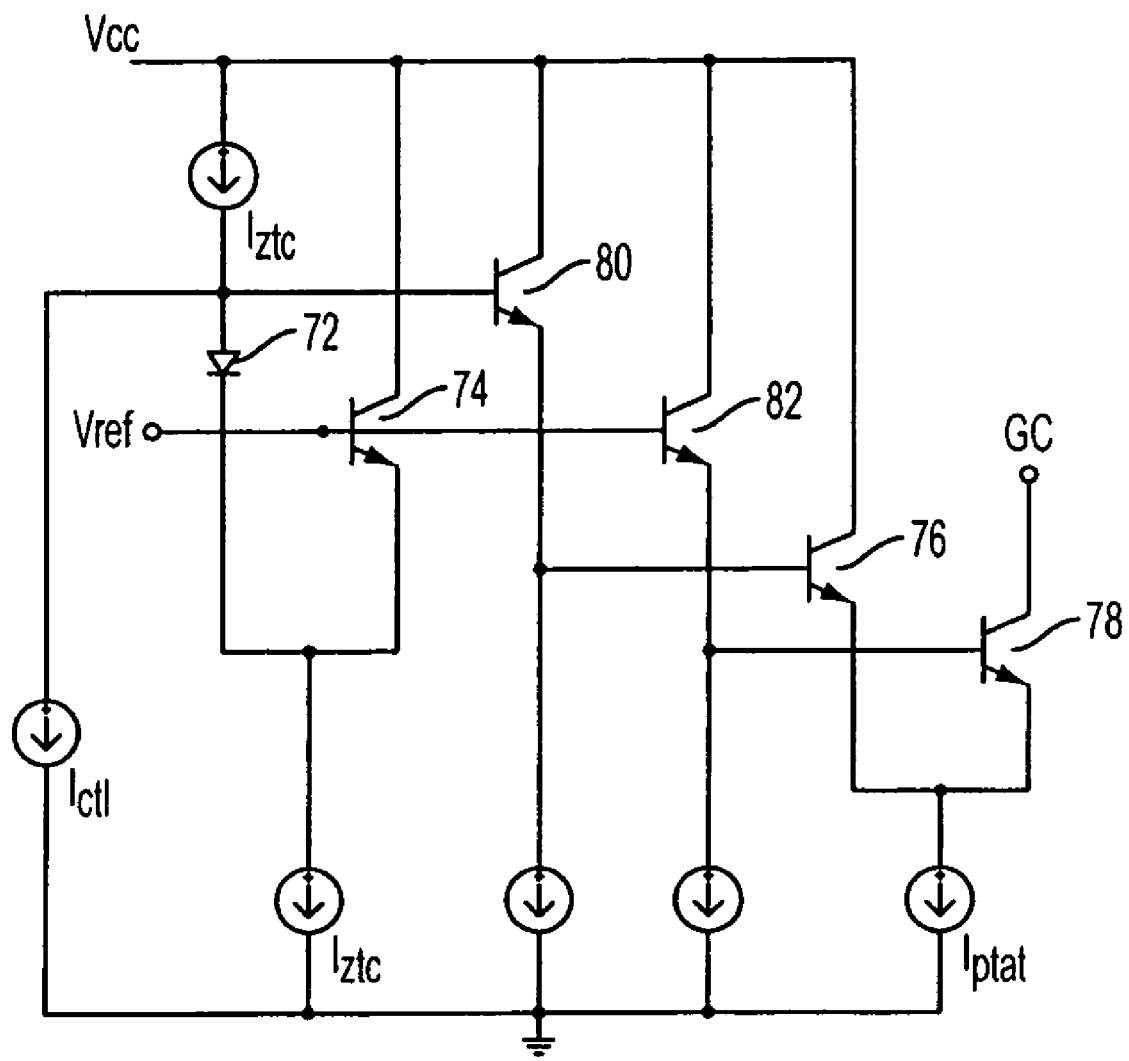
FIG. 6 is a circuit diagram of variation of the circuit of FIG. 5.
Figure 7:
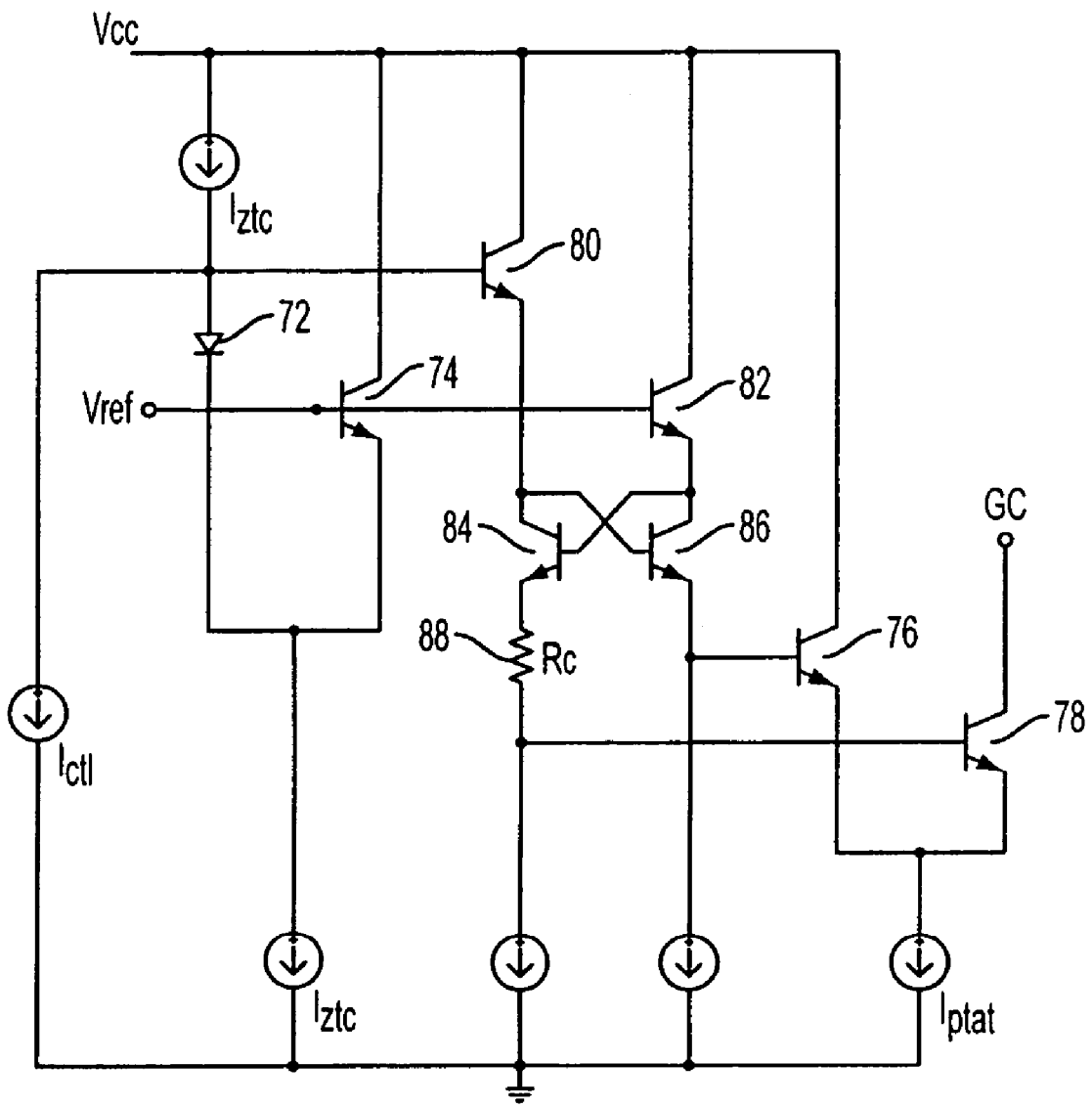
FIG. 7 is a circuit diagram of variation of the circuit of FIG. 6.
Figure 8:
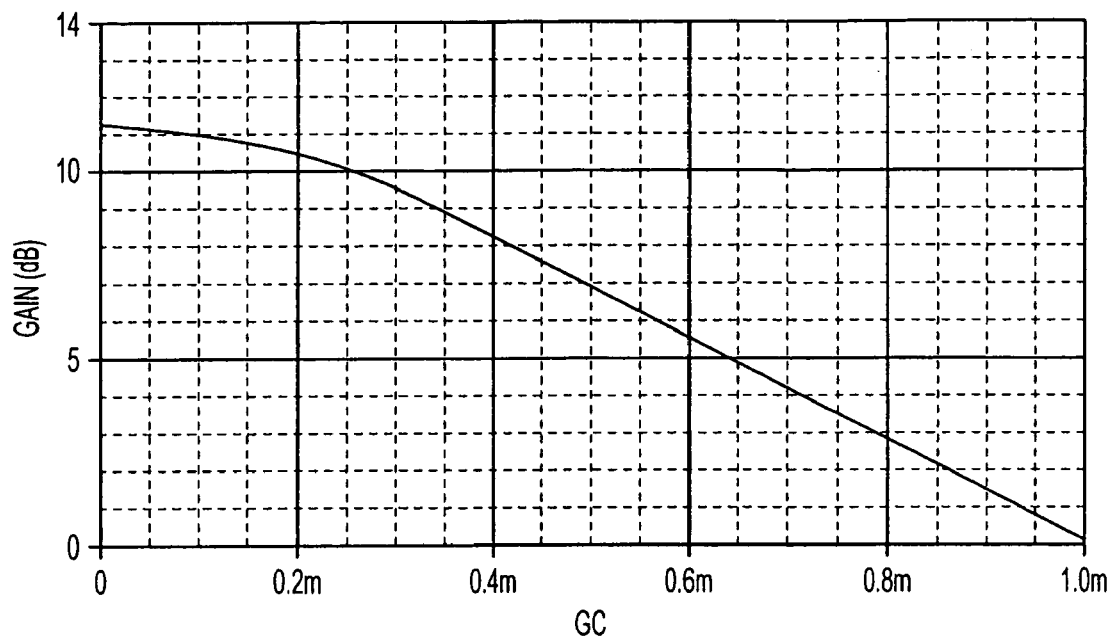
FIG. 8 is a plot of gain vs gain control current for the amplifier of FIG. 7.

Variations of the gain compensation circuit 70 are shown in detail in FIGS. 5-7. These circuits modify the gain control signals that are generated to vary amplifier gain. Temperature compensation is obtained by counteracting the temperature dependent variable $V_T$ in the denominators of the two divisional components of the transconductance gain equation (2). The numerators contain the temperature dependent components $I_{ptat}$ and GC, whereby the ratios are maintained invariable. The gain control current is compensated to be proportional to absolute temperature (PTAT) so that the gain of the variable gain amplifier is independent of the temperature.

FIG. 5 is a simplified temperature compensation circuit that may be employed in the circuit 70 of FIG. 4. $I_{ctl}$ is a control current source that may be derived from a variable gain control voltage setting and is independent of temperature. Coupled in series between source terminals Vcc and ground are zero-temperature-coefficient dc current sources $I_{ztc}$ and base-emitter connected diode 72. Transistor 74 is coupled between Vcc and $I_{ztc}$. Also coupled between Vcc and ground are transistor 76 and current source $I_{ptat}$, which is proportional to absolute temperature. The base of transistor 76 is coupled to the junction between current source $I_{ctl}$ and diode 72. Transistor 78 is coupled to current source $I_{ptat}$. The bases of transistors 74 and 78 are coupled to a voltage reference. Transistor 78 produces a current source GC that is coupled to the control circuits of the differential transistor pairs of FIG. 4.

If the base current of transistor 76 is negligible in comparison to the other circuit currents, the voltage difference between the bases transistors 76 and 78 should closely follow the voltage difference between the bases of diode 72 and transistor 74. The circuit of FIG. 5 linearly converts the temperature-independent gain control current $I_{ctl}$ to PTAT-dependent current GC with current gain amplification that can be derived as follows:

$$V_{be72} - V_{be74} = V_{be76} - V_{be78}$$

$$(I_{ztc} - I_{ctl})/I_{ctl} = (I_{ptat} - GC)/GC$$

$$GC = I_{ctl} * I_{ptat}/I_{ztc} \quad (3)$$

Where $V_{be72}$, $V_{be74}$, $V_{be76}$, $V_{be78}$ are the base emitter voltages of the associated transistors. The impact of the base current of transistor 76 has been neglected on the assumption that $I_{ptat}$ is on the order of $I_{ztc}$ or less. Current will vary from zero to $I_{ptat}$ when the control current $I_{ctl}$ changes from zero to $I_{ztc}$.

When the current gain amplification is large, the base currents of transistors 76 and 78 become significant in comparison to $I_{ctl}$. The base current will be largest when transistor 76 is set to $I_{ptat}$. The GC relationship set forth above will not be held precisely under these extreme conditions. FIG. 6 is a circuit diagram of a variation of the circuit of FIG. 5 that reduces the effects of the base currents by addition of an emitter follower circuit. Emitter follower transistors 80 and 82 are each coupled to a current source between the supply terminals Vcc and ground. The base of transistor 80 is coupled to the junction between current source $I_{ctl}$ and diode 72. The emitter of transistor 80 is coupled to the base of transistor 76. The base of transistor 82 is coupled to the voltage reference. The emitter of transistor 82 is coupled to the base of transistor 78. The emitter followers reduce the effects of the base currents of the transistors 76 and 78 in the circuit of FIG. 5.

The GC relationship is further compromised when $I_{ptat}$ is larger than $I_{ztc}$. When the level $I_{ptat}$ current is large, for example 3 mA in comparison with 100 uA $I_{ztc}$, the base current may be as large as 60 μA (β=50). The emitter followers 80 and 82 will induce voltage error by Vt*1n{(100 μ+60 μ)/100 μ}, or about 12.2 mV. Due to the exponential nature of the translinear loop of equation 1, a large error will be produced in GC. FIG. 7 is a circuit diagram of a variation of the circuit of FIG. 6 that overcomes this effect.

Cross-coupled transistors 84 and 86 are placed in the conduction paths, respectively, of transistors 80 and 82. Resistor 88 is coupled in series with transistor 84. The base of transistor 78 is coupled to resistor 88. The cross-coupled transistors minimize voltage error, as can be appreciated by the following relationships. The translinear loop voltage relationship yields the following:

$$Vb72 - (Vbe80 + Vbe86 + Vb76) = Vb74 - (Vbe82 + Vbe84 + Vb78),$$

Where "b" represents base voltage and "be" represents base-emitter voltage of the respective transistors. As transistor 80 conducts the same collector current as transistor 84, and transistor 82 conducts the same collector current as transistor 86, Vbe80=Vbe 84 and Vbe82=Vbe 86. Thus:

$$Vb72 - Vb76 = Vb74 - Vb78 \text{ Or } Vb72 - Vb74 = Vb76 - Vb78.$$

The voltage error induced by the emitter followers caused by large base currents at transistors 76 and 78 is effectively eliminated by the cross-coupled transistors 84 and 86.

Figure 1:
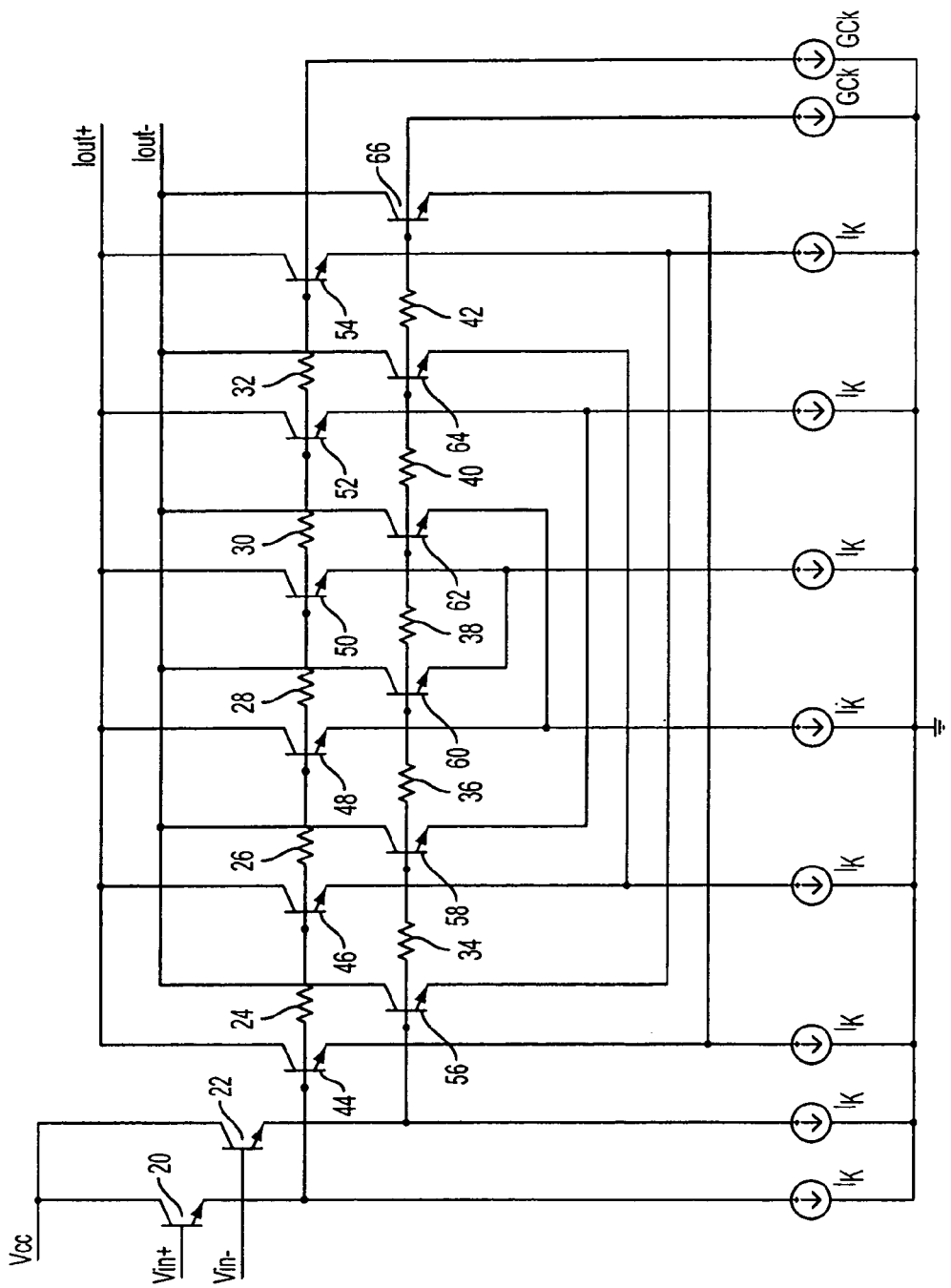
FIG. 1 is a circuit diagram of one stage of a variable gain amplifier known in the prior art.
Figure 2:
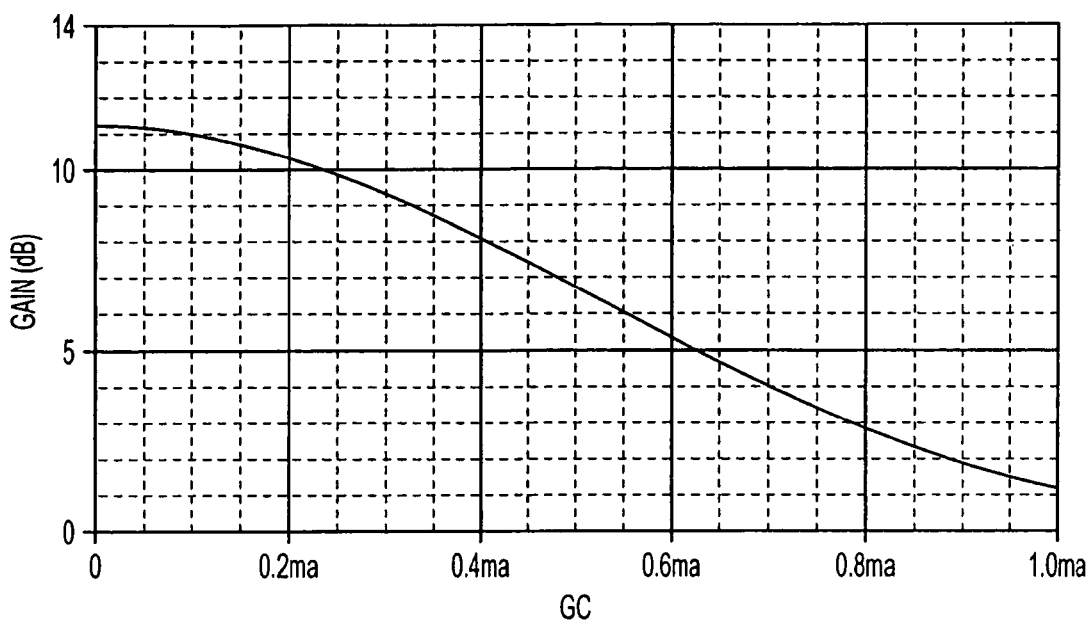
FIG. 2 is a plot of gain vs gain control current for the amplifier of FIG. 1.
Figure 3:
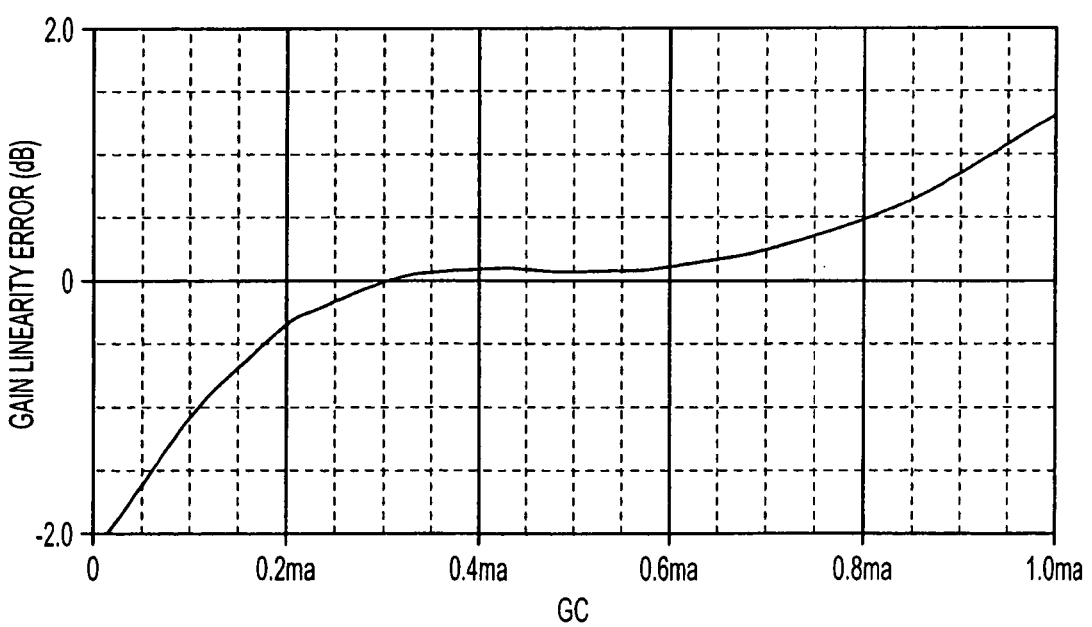
FIG. 3 is a plot of gain linearity error vs gain control current for the amplifier of FIG. 1.
Figure 9:
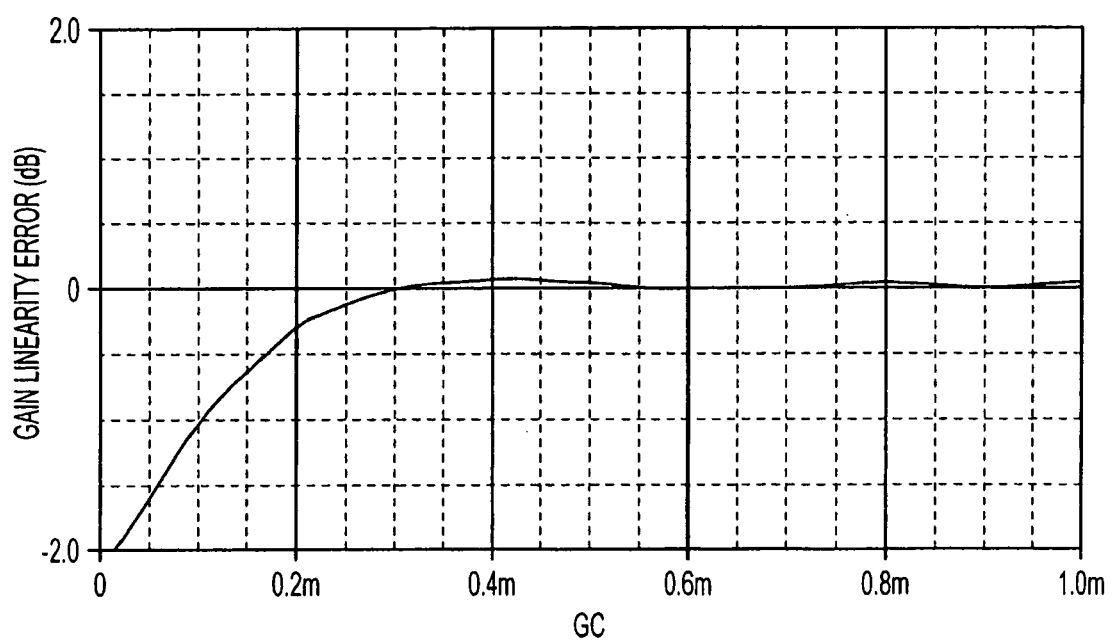
FIG. 9 is a plot of gain linearity error vs gain control current for the amplifier of FIG. 7.

The circuit of FIG. 7 also corrects for the prior art nonlinear-in-dB gain as a function of GC as exemplified in FIGS. 2 and 3. To compensate for the error shown in the range above 0.6 m of those plots, more DC current is needed to pull the gain down for the same control current. The desired linear curvature is obtained by insertion of resistor 88 and its effect in circuit with the base resistances of transistors 76 and 78. Gain linearity is plotted in FIG. 9. As can be seen from the latter figure, there is substantially no linearity error from a GC of approximately 0.4 mA throughout the remaining range.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein.

What is claimed is:

1. A variable gain amplifier comprising:
   a plurality of differential transistor pairs coupled in parallel, wherein
   each transistor pair is coupled to a temperature dependent current source,
   control inputs of the transistor pairs are coupled to a temperature dependent gain control signal, and
   a temperature compensation circuit configured to generate the temperature dependent gain control signal, the temperature compensation circuit comprising:
   a first transistor having a control terminal coupled to a control current source and to a zero temperature coefficient source and an output terminal coupled to current source proportional to temperature; and
   a second transistor having an output terminal coupled to the current source proportional to temperature;
   wherein the conduction current of the second transistor is applied as the temperature dependent gain control signal.

2. A variable gain amplifier as recited in claim 1, further comprising emitter follower circuits coupled, respectively, to control terminals of the first and second transistors.

3. A variable gain amplifier as recited in claim 2, further comprising cross-coupled transistors coupled between the emitter follower circuits and the control terminals of the first and second transistors.

4. A variable gain amplifier as recited in claim 2, further comprising a voltage offset circuit coupled between the cross-coupled transistors and a control terminal of the second transistor.

5. A variable gain amplifier as recited in claim 1, wherein:
   control inputs of first transistors of the transistor pairs are coupled to each other in series through respective impedances and to the temperature dependent gain control signal; and
   control inputs of second transistors of the transistor pairs are coupled to each other in series through respective impedances and to the temperature dependent gain control signal.

6. A method of controlling a variable gain amplifier composed of a plurality of parallel coupled differential transistor pairs, the method comprising:
   producing a temperature dependent current source in the current path of each differential transistor pair;
   generating a gain control current corresponding to a desired gain;
   converting the generated control current to a temperature dependent gain control current and
   applying the temperature dependent gain control current source in circuit with control inputs of the transistors of the paired differential transistors; and modifying the temperature dependent gain control current source to compensate for gain non-linearity.

7. A method as recited in claim 6, wherein the step of modifying comprises introducing an offset as a function of the gain control current.

8. A method of controlling a variable gain amplifier composed of a plurality of parallel coupled differential transistor pairs, the method comprising:

producing a temperature dependent current source in the current path of each differential transistor pair;

generating a gain control current corresponding to a desired gain;

converting the generated control current to a temperature dependent gain control current source;

applying the temperature dependent gain control current source in circuit with control inputs of the transistors of the paired differential transistors;

wherein the step of converting comprises;

generating a temperature dependent current source; and multiplying the control current by the temperature dependent current source.

* * * * *